(12) United States Patent
Issaa

(10) Patent No.: US 6,547,569 B1
(45) Date of Patent: Apr. 15, 2003

(54) PC/104 OR PC/104+ CONNECTOR WITH SELECTED PIN ISOLATION FEATURE

(75) Inventor: Michael A. Issaa, Morgan Hill, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/015,462

(22) Filed: Dec. 13, 2001

(51) Int. Cl.[7] ............................................... H01R 12/00
(52) U.S. Cl. ........................... 439/65; 439/75; 439/148; 439/528; 439/924.1
(58) Field of Search .......................... 439/60, 65, 148, 439/528, 924.1, 149, 75

(56) References Cited

U.S. PATENT DOCUMENTS

| | | | |
|---|---|---|---|
| 4,891,017 A | * | 1/1990 | Kuhn et al. .................. 439/380 |
| 5,176,528 A | * | 1/1993 | Fry et al. ..................... 439/181 |
| 5,613,864 A | * | 3/1997 | Northey ....................... 439/149 |
| 5,704,796 A | * | 1/1998 | Swenson ..................... 439/148 |
| 6,193,529 B1 | * | 2/2001 | Kimura ....................... 439/149 |

OTHER PUBLICATIONS

PC/104–Plus Specification, Version 1.0, Feb. 1997, PCI Special Interest Group, P.O. Box 14070, Portland, OR 97214.

* cited by examiner

*Primary Examiner*—P. Austin Bradley
*Assistant Examiner*—Truc Nguyen
(74) *Attorney, Agent, or Firm*—Charles E. Krueger

(57) ABSTRACT

An improved PC/104 connector includes a pin by pin isolation mechanism to allow a standard PC/104 connector pin to transmit non-PC, vendor-specific I/O signals between stacked PC/104 modules.

8 Claims, 4 Drawing Sheets

PC/104 OR PC/104+ CONNECTOR WITH SELECTED PIN ISOLATION FEATURE

BACKGROUND OF THE INVENTION

PC/104 is a de facto standard (IEEE P996.1 standard for Compact Embedded-PCModules) which has a compact form-factor (size 3.6 by 3.8 inches) and a unique self-stacking bus which eliminates the cost and bulk of back planes and card cages. The PC/104 cards use pin-and-socket connectors that are rugged and reliable. The electrical bus is a relaxed bus drive (6 mA) which lowers power consumption (to 1–2 Watts per module) and minimizes component count.

FIG. 1 depicts a module stack of PC/104 cards. The distance between cards 10a–d is precisely controlled by the use of spacers 12. The details of the connector are depicted in detail in FIGS. 2A and B. In FIGS. 2A and B, stack-through cards use passthrough connectors having male and female parts. A female connector assembly 16 is included on each card 10.

Conventional electrical connector assemblies include complementary male and female connectors for establishing electrical connections between electrical systems and components. The standard PC/104 connectors on a designated card are designed to supply signals to components on the designated card and also to pass signals between cards stacked below the designated card and cards stacked above the designated card.

The pins of the PC/104 connectors are assigned to signals of the ISA bus. Thus, all signals generated by components on a PC/104 card that are transmitted via pins on the PC/104 connector must comply with the ISA specification for the signal carried by that pin.

The PC/104 standard has been extended by the PC/104-Plus standard which incorporates all the features of PC/104 but also includes an additional connector that supports the PCI bus. In the following, for convenience, reference-to PC/104 is to be understood to include reference to the PC/104-Plus.

Referring to FIGS. 2A and B, to accomplish the pass-through function, the connectors include a female connector assembly 16 having an array of pin slots 18 formed therein. The pins 28 include an elongated male connector portion 30, a head 31, and a female connector portion 32. There are various pin configurations used in the industry. In one type of connector, the female connector portion 32 is in the form of a clip attached to the head of the pin. The clip can include tabs 33 that recess into a notch formed in the pin slot. When the pin is inserted into the slot the tab engages the notch to precisely control the depth of insertion of the pin into the bottom of the pin slot 18. The female connector assembly 16 is mounted on the major surface of a first card 10a. A first set of pins 34 have their heads inserted into the female connector assembly 16 mounted on the first card 10a and pass through plated holes in the card which are connected to electrical traces on the card that transmit signals to components on the card.

A second set of pins 36 are inserted into the female connector assembly 16 of a second card 10b stacked above the first card. The spacers 12 for stacking the cards, the length of the pins, and the precisely controlled insertion depth of the female connectors are designed so that the male connector portions 30 of the second set of pins 36 are aligned with pin slots and so that the ends of the male connector portions 30 of the second set of pins 36 are inserted a precise distance into the pin slot and engage the female connector portions 32 of the first set of pins 34 to establish an electrical connection to conduct the signals to the components on the second card.

Companies embedding PC technology, having applications where space is limiting, can now benefit from a standardized system architecture complete with a wide range of multi-vendor support. For PC/104 modules that require I/O interconnect of signals not defined for PC/104 or PC/104-Plus connector buses various techniques are utilized.

One technique is to use custom I/O connectors that are typically designed by vendors to interconnect I/O signals between modules from the same vendors. Depending on the number of interconnecting I/O signals required and the density of each board, the I/O custom connectors can quickly become an a problem because board space is valuable in a compact architecture design.

Another technique is to transform the non-standard signal to a bus signal, transmits the converted signal to the next card using the connector, and then transform the bus signal back to the not-standard signal. The problem with this technique is that extra components for transforming the signals are required which adds to the complexity and cost of the system.

BRIEF SUMMARY OF THE INVENTION

According to one aspect of the invention, these problems are solved by re-using the PC/104 connector pins for non-bus I/O signals between modules without interfering with the PC/104 electrical bus specifications.

According to another aspect of the invention, for certain PC/104 modules designs that do not necessarily use the entire pin count on the PC/104 connector, the unused pins on the PC/104 are used to route required extra I/O signals in between these modules.

According to another aspect of the invention, in order not to interfere with PC/104 electrical connecting bus, these identified pins that are design specific, can be made to connect the two or more modules together, while keeping electrical isolation from the originally designated pins stated by the PC/104 spec.

According to another aspect of the invention, one of the modules is the "bottom module" i.e. non-stacking, while the next module stacked above it, is the module to which the I/O signals need to route to. To isolate the I/O signals from the main PC/104 bus, the upper module connector provides the isolation. The isolation mechanism is achieved by recessing the metal connector within the pins socket, and partially plugging the hole itself This mechanism eliminates any interference with the PC/104 bus stack up modules, while allowing unused pins to be used for routing channels within the PC/104 connector.

Other features and advantages of the invention will be apparent in view of the following detailed description and appended figures.

DETAILED DESCRIPTION OF THE EXEMPLARY EMBODIMENTS

The invention will now be described with reference to the various embodiments. Like or corresponding elements in the several views will be designated by the same reference numbers.

Figure 1:
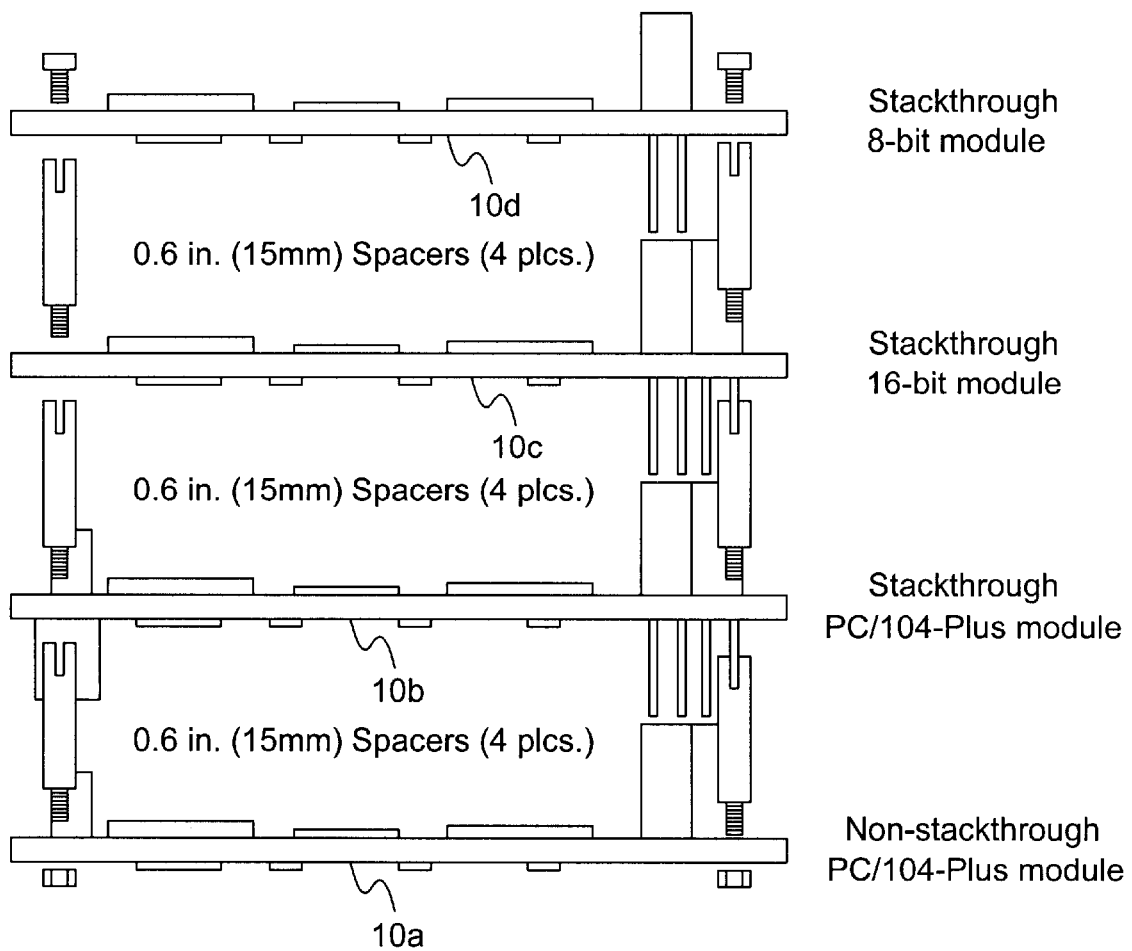
FIG. 1 is a view depicting stacked PC/104 modules.
Figure 2A:
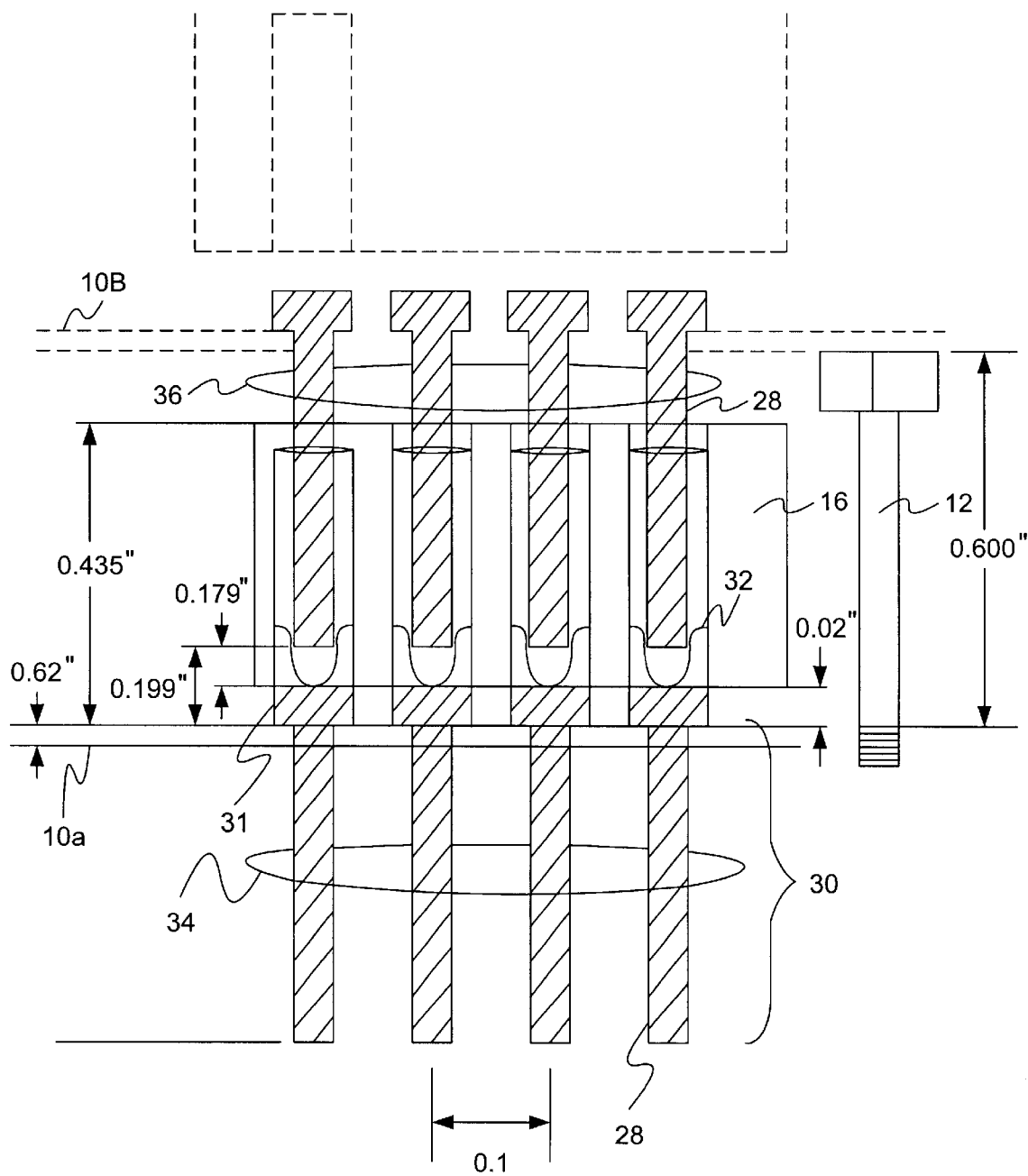
FIG. 2A is schematic diagram depicting the standard PC/104 stackthrough connector.
Figure 2B:
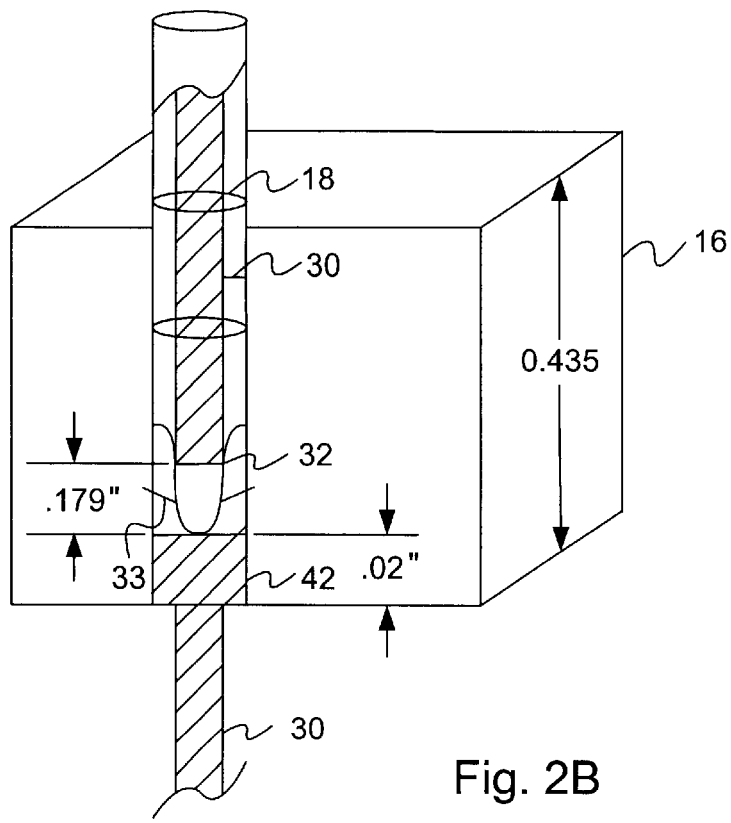
FIG. 2B is a perspective view of the details of a standard PC/104 connector.
Figure 3B:
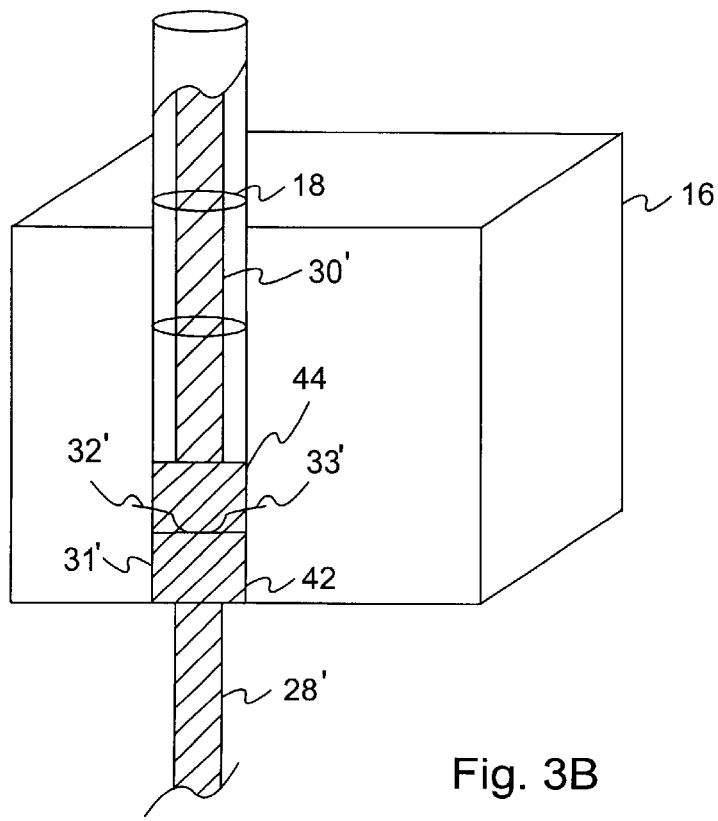
FIG. 3B is a perspective diagram depicting a modified PC/104 stackthrough connector.
Figure 3A:
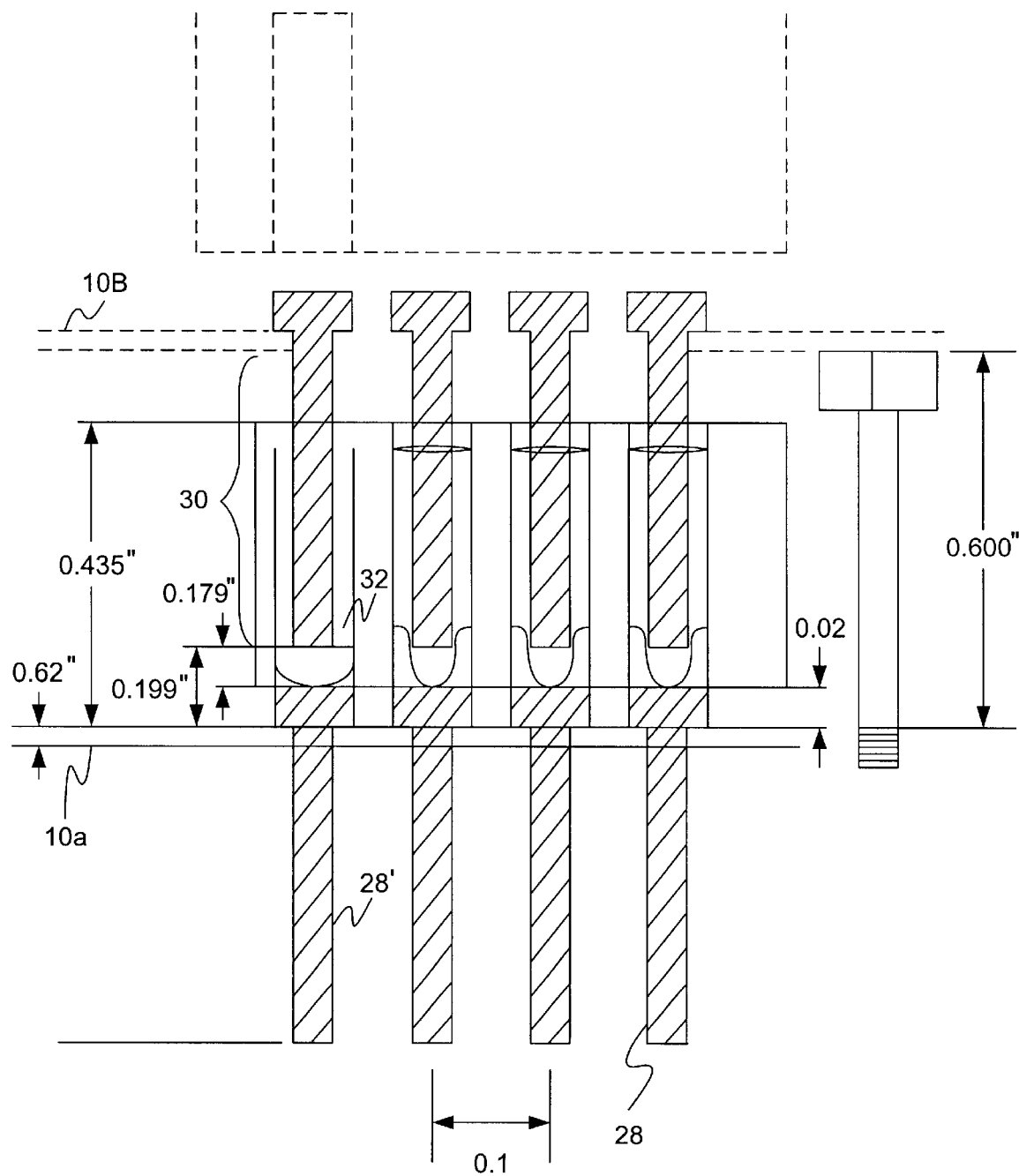
FIG. 3A is a schematic diagram depicting an embodiment of the invention.

An embodiment of the invention is depicted in FIGS. 3A and B, where a first card 10*a* is located below a second card 10*b*. Since the connectors for PC/104 specs are standards and provide pass through signals, it is currently not possible to pass non-standard I/O signals without adding a vendor-specific additional connector. The currently described embodiment is a new design of the module connector in which an isolation mechanism on a per pin basis is provided.

In this embodiment, a modified female connector portion 32' of a selected pin 28' in the first set of pins 34 is shortened so that the male portion 30 of a corresponding pin from the second set of pins 36 does not contact the modified female connector portion 32' of the selected pin when the cards are stacked. Additionally, the pin slot that holds the selected pin can be partially plugged with an insulating material 44 to further isolate the corresponding pin of the second set from the standard PC/104 signals.

For the type of pin illustrated in the figures, the female connector portion is a clip which is shortened to recess the female connector in the pin slot. Because of the precise spacing between cards resulting from using the spacers and the tight tolerances of the connector assemblies it is assured that the pins from the second card do not contact the modified female connectors on the second card.

Alternatively, the male connector portion of the corresponding pin from the second set of pins could be shortened so as not to contact the standard female connector portion of the selected pin 28'.

Thus, selected pins of the second card 10*b* can be electrically isolated from the PC bus and can be used to connect non-PC/104 I/O signals generated by modules on the first card to other modules located on the second card. The isolation feature described above is implemented in the second card to isolate cards stacked above the second card from receiving non-ISA (or in the case of PC 104-Plus, non-ISA or non-PCI signals).

An example of a system utilizing this embodiment will now be described. In FIG. 3A, the first card 10*a* is a non-stackthrough module. In this example, a controller on the first card generates a non-bus LED control signal to turn an LED on the second card ON or OFF. A non-used bus pin in the stackthrough connector is utilized to transmit the LED control to the second card. In this example, the third card, stacked above the second card, includes a controller that generate a complete set of ISA and/or PCI signals.

Accordingly, the pin used to transmit the LED control signal from the first to the second card must be electrically isolated from the third card to prevent interference with the standard bus signals generated by the third card.

To accomplish the same objective using prior art techniques requires either an additional connector for transmitting the LED control signal between the first and second cards or components on the first card for transforming the LED control signal to a bus signal and on the second card for transforming the bus signal back to the LED control signal. Thus, the ability to provide customized pin by pin isolation substantially simplifies the design and layout of PC/104 cards and reduces system cost.

In practice, the designer of the module informs the connector manufacturer which pin slots in the female connector assembly need to include the isolation feature. The manufacturer will then insert modified isolation female connectors in specified pin slots.

The invention has now been described with reference to the preferred embodiments. In the above, the invention has been described with reference to a particular female connector implementation. However, the invention is not limited to any implementation of the pin or female connector and alternative connector assemblies such as ring clips, etc. may be utilized as long as the connector is recessed to that there is no electrical contact with the pins from the card stacked above. Alternatives and substitutions will now be apparent to persons of skill in the art. Accordingly, it is not intended to limit the invention except as provided by the appended claims.

What is claimed is:

1. An improved passthrough connector for a first card having a first connector assembly that utilizes standard pins having male and a female connector portions, with the first connector assembly including a first pin slot having a female connector portion of a first standard pin inserted therein, and with the first pin slot for guiding the male connector portion of a second standard pin, inserted in a second connector assembly disposed on a second card stacked with the first card, so that the male connector portion of the second standard pin makes contact with the female connector portion of the first standard pin when the first and second cards are stacked, with the length of the male and female connector portions of the standard pins and hardware for stacking the cards designed so that a specified length of the male connector portion of the second standard pin is inserted into the first pin's slot and mechanically abuts the female connector portion of the first standard pin inserted in the first pin slot to form an electrical connection to conduct signals from the female connector portion of the first standard pin to the male connector portion of the second standard pin when the first and second cards are stacked, the improvement comprising:

an isolation pin having a female connector portion which is shorter than the female connector portion of the standard pin inserted into a selected pin slot of the first connector assembly so that the female connector of the isolation pin is recessed in the selected pin slot to form a gap between the female connector portion of the isolation pin and an inserted male connector portion of the second pin when the first and second cards are stacked to prevent mechanical contact between the female connector portion of the isolation pin and male connector portion of the second pin when the first and second cards are stacked.

2. An improved passthrough connector comprising:

a female connector assembly having a plurality of pin slots formed therein, with each pin slot having a female end, located next to a first card upon which the female connector assembly is to be mounted, and a male end;

an isolation female connector inserted into female end of a selected pin slot in said connector with the length of the isolation female connector shorter than the length of a standard passthrough female connector so that the isolation female connector is recessed in the selected pin slot and a first male pin connector from a second card stacked a predetermined distance above the first card does not contact the isolation female connector.

3. The connector of claim 2 further comprising:

an electrical plug, disposed over the isolation female connector and filling a gap between the recessed isolation female connector and the first male pin connector, for further electrically isolating the first male pin connector from the isolation female connector.

4. The connector of claim 3 further comprising:

a male connector pin inserted in the female end of the selected pin below said isolation female connector and in electrical contact with said isolation female connector, for conducting signals between the first card and a card stacked below the first card.

5. A method for modifying a passthrough connector to electrically isolate selected pins, with a first card having a first connector assembly that utilizes standard pins having male and female connector portions, with the first connector assembly including a plurality of pin slots, with a first pin slot having a female connector portion of a first standard pin inserted therein, and with the first pin slot for guiding the male connector portion of a second standard pin, inserted in a second connector assembly disposed on a second card stacked with the first card, so that the male connector portion of the second standard pin makes contact with the female connector portion of the first standard pin when the first and second cards are stacked, with the length of the male and female connector portions of the standard pins and hardware for stacking the cards designed so that a specified length of the male connector portion of the second standard pin is inserted into the first pin's slot and mechanically abuts the female connector portion of the first standard pin inserted in the first pin slot to form an electrical connection to conduct signals from the female connector portion of the first standard pin to the male connector portion of the second standard pin when the first and second cards are stacked, the method comprising the acts of:

selecting a selected pin slot having a pin inserted therein utilized by the first card to receive a non-standard signal;

inserting a recessed female connector inserted into a first end of the selected pin slot so that the recessed female connector does not make contact with a second pin inserted into the selected pin slot when the second card is stacked above the first card to electrically isolate the second pin from the first pin so that the non-standard signal is not transmitted to the second card.

6. The method of claim further comprising the act of:

forming an insulating plug above the recessed female connector to further isolate the second pin from the recessed female connector.

7. An improved passthrough connector for a first card having a first connector assembly that utilizes standard pins having male and female connector portions, with the first connector assembly including a first pin slot having a female connector portion of a first standard pin inserted therein, and with the first pin slot for guiding the male connector portion of a second standard pin, inserted in a second connector assembly disposed on a second card stacked with the first card, so that the male connector portion of the second standard pin makes contact with the female connector portion of the first standard pin when the first and second cards are stacked, with the length of the male and female connector portions of the standard pins and hardware for stacking the cards designed so that a specified length of the male connector portion of the second standard pin is inserted into the first pin's slot and mechanically abuts the female connector portion of the first standard pin inserted in the first pin slot to form an electrical connection to conduct signals from the female connector portion of the first standard pin to the male connector portion of the second standard pin when the first and second cards are stacked, the improvement comprising:

means for preventing electrical contact between the female connector portion of a pin inserted into a selected slot and an inserted male connector portion of the second pin when the second card is stacked over the first card to prevent mechanical contact between the female connector portion of the pin inserted in the selected slot and male connector portion of the second pin; and means for electrically insulating the female connector portion of the pin inserted into the selected slot from inserted male connector portion of the second pin.

8. The connector of claim 1 further comprising:

an insulating plug disposed in the pin slot above the female connector portion of the isolation pin to fill the gap and electrically isolate the second pin from the isolation pin.

* * * * *